(12) United States Patent  
Cleeves

(10) Patent No.: US 7,675,464 B2  
(45) Date of Patent: Mar. 9, 2010

(54) PLATED ANTENNA FOR HIGH FREQUENCY DEVICES

(75) Inventor: James Montague Cleeves, Redwood City, CA (US)

(73) Assignee: Kovio, Inc., Milpitas, CA (US)

( * ) Notice: Subject to any disclaimer, the term of this patent is extended or adjusted under 35 U.S.C. 154(b) by 223 days.

(21) Appl. No.: 11/749,114

(22) Filed: May 15, 2007

(65) Prior Publication Data

US 2007/0262471 A1 Nov. 15, 2007

(51) Int. Cl.
*H01Q 1/38* (2006.01)
(52) U.S. Cl. ............... 343/700 MS; 343/741; 343/846; 343/867; 343/895
(58) Field of Classification Search .......... 343/700 MS, 343/741, 742, 829, 846, 866, 867, 895
See application file for complete search history.

(56) References Cited

U.S. PATENT DOCUMENTS

| | | | | |
|---|---|---|---|---|
| 5,451,914 A | * | 9/1995 | Stengel | 333/25 |
| 5,812,038 A | * | 9/1998 | Gu et al. | 333/219 |
| 5,854,492 A | * | 12/1998 | Chinone et al. | 257/31 |
| 6,154,026 A | * | 11/2000 | Dantsker et al. | 324/248 |
| 6,421,013 B1 | * | 7/2002 | Chung | 343/700 MS |
| 6,798,204 B2 | * | 9/2004 | Seeber et al. | 324/318 |
| 7,158,033 B2 | * | 1/2007 | Forster | 340/572.1 |
| 7,298,331 B2 | * | 11/2007 | Oberly | 343/700 MS |

* cited by examiner

*Primary Examiner*—Douglas W Owens
*Assistant Examiner*—Chuc D Tran
(74) *Attorney, Agent, or Firm*—The Law Offices of Andrew D. Fortney; Andrew D. Fortney; Sharon E. Brown Turner

(57) ABSTRACT

A method of making a double-sided antenna for high frequency devices is discussed. The method includes forming metal patterns on both sides of a substrate having pre-formed connection holes. Preferably, the metal patterns are formed using a printing ink having a precursor and a solvent. In one embodiment, the metal patterns include coils which are formed on both sides of the substrate. In one embodiment, shunt bars are used to speed up the process of making the metal patterns. The shunt bars are punched out at the end of the process to electrically isolate the metal patterns.

29 Claims, 3 Drawing Sheets

PLATED ANTENNA FOR HIGH FREQUENCY DEVICES

FIELD OF THE INVENTION

The present invention generally relates to the field of antennas for devices and methods of making the same. More specifically, embodiments of the present invention pertain to double-sided antennas for high frequency devices and their manufacturing and/or production.

DISCUSSION OF THE BACKGROUND

High frequency antennas are known in the art. In one method of making such an antenna, electroplating or electroless plating is used to plate one side of a substrate with an antenna pattern. The pattern is printed on one side of the substrate using a seed ink. Upon printing the pattern, the substrate is then electroplated, forming a metallic antenna over the antenna pattern. Since electroplating (or electroless plating) in such antennas is often a one sided operation, a second operation is needed to connect a strap from one end of the antenna to a second end of the antenna. Additionally, electroplating on seed ink is limited by the distance from a supply rail to the furthest point from the rail. Long distances from the supply rail make for long plating times. Moreover, if a double-sided antenna is to be made, the additional operations of printing a pattern on a second side of the substrate and then electroplating that side also need to be performed.

In another method, a conductive line, without loops, may be formed on the second side of the substrate by printing a conductive line pattern on the second side of the substrate using a seed ink and then later electroplating the second side, thus forming the conductive line. A channel may be formed through a hole in the substrate connecting the conductive line with an antenna formed on the first side of the substrate. The hole is punched through the substrate after the seed ink is printed on the second side of the substrate, but before the conductive line is formed through electroplating.

While the conventional solutions for electroplating or electroless plating of electronic devices are advantageous for their intended purposes, a need still exists for a method for double-sided plating of high frequency electronic devices with a plating time that is comparatively less than that of conventional plating. Additionally, a need exists for a simplified method of making a double-sided device, for example, an antenna used for high frequency devices such as HF or RFID tags. Moreover, a need exists for connecting both sides of a substrate for a double-sided electronic device in a minimal number of operations or steps.

The present invention concerns an electronic device (and in particular, a double sided high frequency antenna) and a process for making the same, utilizing a substrate with pre-formed holes, reducing the number of steps required to form the electronic device.

SUMMARY OF THE INVENTION

The present invention is defined by the following claims, and nothing in this section should be taken as a limitation on those claims. By way of introduction, the preferred embodiments described below relate to an electronic device, such as a double-sided high frequency antenna and a method of making the same. The method generally comprises the steps of (a) forming a first metal pattern including a first coil on a first side of the substrate and (b) forming a second metal pattern including a second coil on a second side of the substrate. The first metal pattern is coupled to the second metal pattern through a connection formed in the connection hole. Preferably, the first and second metal patterns include one or more shunt bars, and are formed by printing an ink having a plating material and a solvent onto the substrate. Preferably, the semiconductor substrate has one or more pre-formed connection holes through the substrate.

In one embodiment, at least one disconnection hole is formed in the substrate between loops in the first coil. The disconnection hole breaks the connection formed by the shunts in the first and second metal patterns.

The present invention advantageously provides a low cost method for making double-sided antennas in a reduced amount of time with a reduced number of steps. Such antennas are particularly suitable for use in high frequency applications (e.g., for receiving and/or transmitting radio frequency [RF], HF, very high frequency [VHF] and ultra high frequency [UHF] signals). By providing a semiconductor substrate with pre-formed connection holes, metal patterns can be simultaneously formed on both sides of the substrate using a single electroplating or electroless plating operation. Additionally, by using shunts in the first and second metal patterns, the first and second metal patterns can be formed in less time.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications

Figure 1:
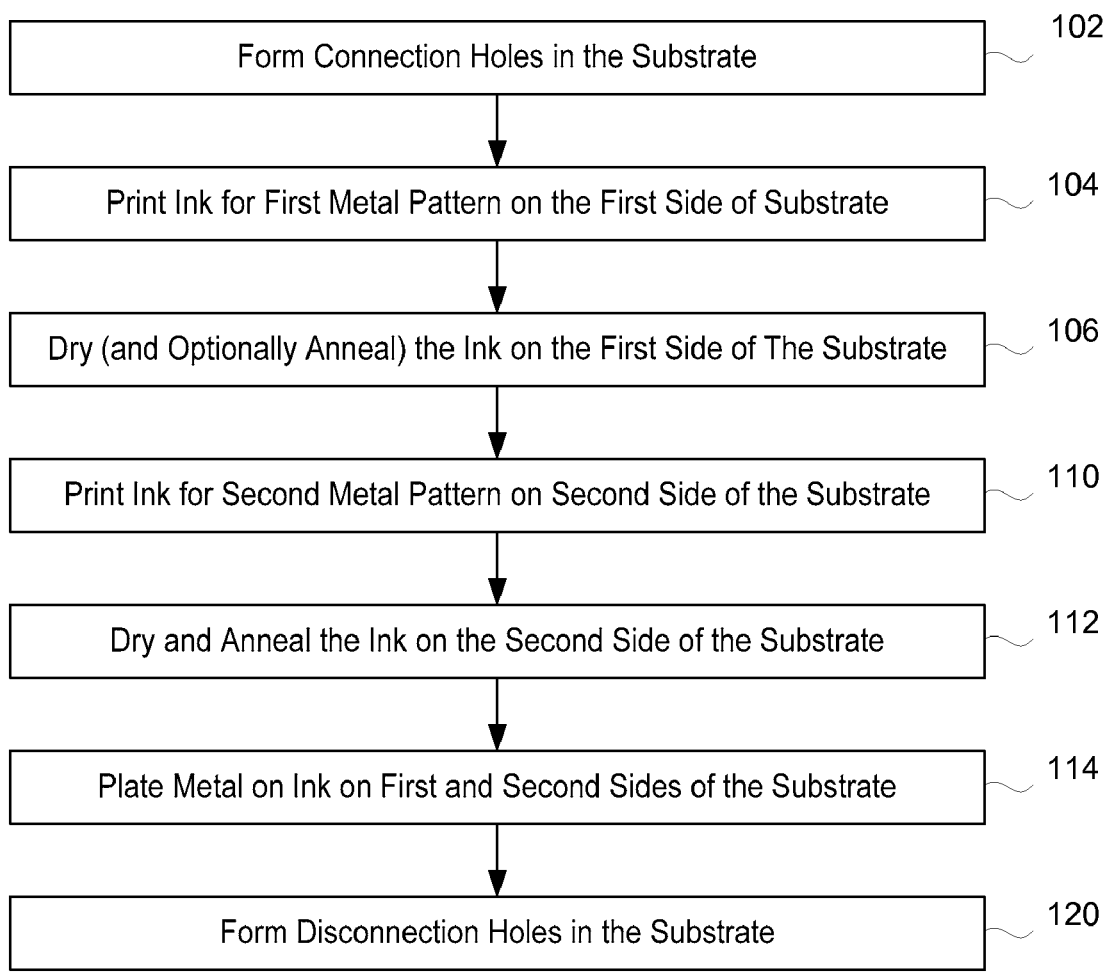
FIG. 1 shows a process flow chart for making an electronic device using electroplating or an electroless plating method according to one embodiment of the present invention.

It should be appreciated that for simplicity and clarity of illustration, elements shown in the Figures have not necessarily been drawn to scale. For example, the dimensions of some of the elements may be exaggerated relative to each other for clarity. Further, where considered appropriate, reference numerals have been repeated among the Figures to indicate corresponding elements.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

For the sake of convenience and simplicity, the terms "coupled to," "connected to," and "in communication with" (and variations thereof) mean direct or indirect coupling, connection or communication, unless the context clearly indicates otherwise. These terms are generally used interchangeably herein, and wherever one such term is used, it also encompasses the other terms, unless the context clearly indicates otherwise. In the present disclosure, the term "deposit" (and grammatical variations thereof) is intended to encompass all forms of deposition, including blanket deposition, coating, and printing. Furthermore, with regard to certain materials, the phrase "consisting essentially of" does not exclude intentionally added dopants, which may give the material to which the dopant is added (or the element or structure formed from such material) certain desired (and potentially quite different) physical and/or electrical properties.

The present invention includes a method of making an electronic device which includes a double-sided antenna, generally comprising the steps of (1) forming a first metal pattern on a first side of a substrate, wherein the substrate includes at least one pre-formed connection hole through the substrate; and (2) forming a second metal pattern on a second side of the substrate, wherein the first metal pattern is coupled to the second metal pattern through a connection formed in the connection hole. Preferably, the first and second patterns include a coil and one or more shunts (or shunt bars) between adjacent loops in the coil. In a further aspect, the present invention concerns an electrical device, comprising (a) a substrate including a connection hole formed through the substrate; (b) a first metal pattern on a first side of a substrate, the first metal pattern comprising a first coil; (c) a second metal pattern on a second side of the substrate opposite to the first side, wherein the first metal pattern is coupled to the second metal pattern through a connection formed in said connection hole; and (d) at least one disconnection hole in the substrate between loops in the coils. The invention, in its various aspects, will be explained in greater detail below with regard to exemplary embodiments.

Figure 2:
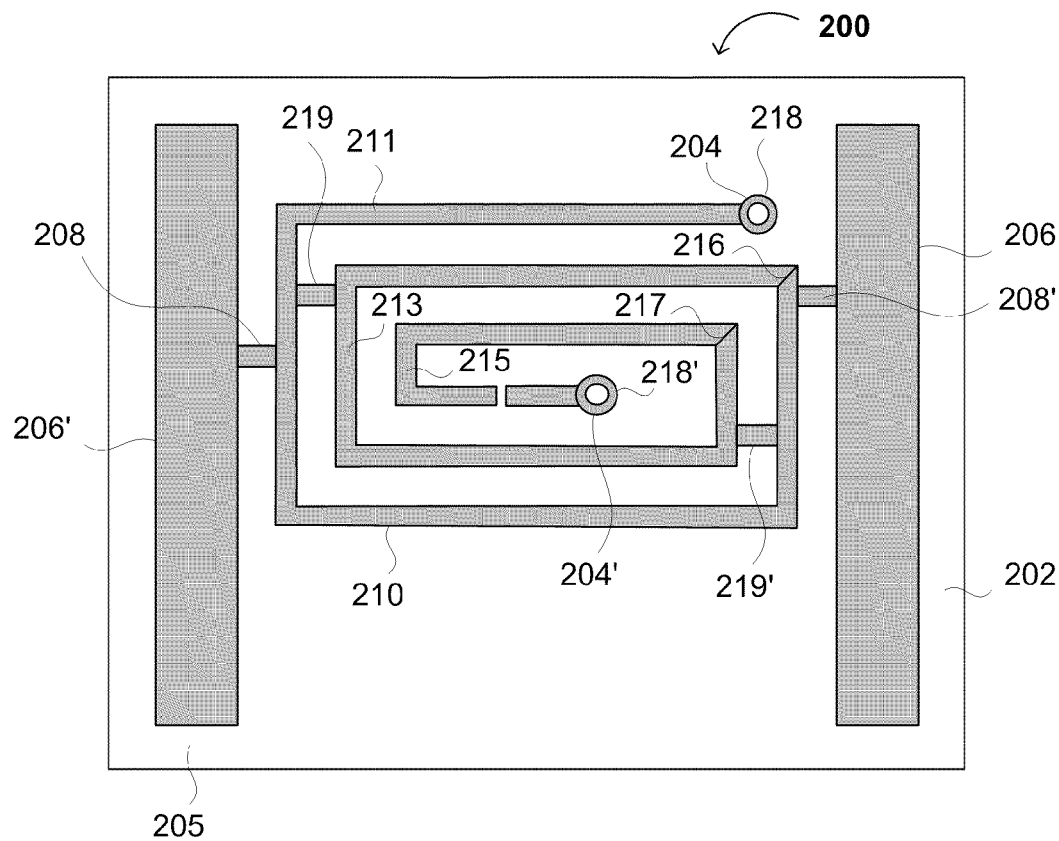
FIG. 2 shows a process of forming of a first metal pattern on one side of a substrate, according to one embodiment of the present invention.

In one aspect, the present invention concerns a method for manufacturing an electrical device, such as a double-sided high frequency antenna useful for applications such as RFID tags, as described below with reference to FIGS. 1-4. As shown in FIG. 1 at step 102, the method first includes forming connection holes in the substrate. Alternatively, the substrate may be provided with pre-formed connection holes (which may be formed by step 102 or a step similar thereto). Referring now to FIG. 2, the connection holes 204, 204' are formed through the substrate 200 before forming first and second metal patterns 205, 209, as discussed herein. Suitable substrates for use as substrate 200 include silicon substrates, quartz substrates, glass substrates, metal substrates, and polymeric substrates, such as polyimide.

The connection holes 204, 204' are preferably formed using a hole punch, which may be automated (thereby enabling an automated hole-punching process). However, any known method or device for forming holes through a substrate may be used, such as etching a hole, drilling a hole, and using a laser to burn a hole. Preferably, at least one (and preferably, both) of the connection holes 204, 204' overlap with, are adjacent to or are placed in alignment with the coils 210, 210' of each of the first and second patterns 205, 209 (see also FIG. 3). In one embodiment, the connection holes 204, 204' are pre-punched into the substrate 200 before the formation of any metal patterns 205, 209. In another embodiment, the connection holes 204, 204' may be formed from the front or first side 202 to the back or second side 203 of the substrate 200.

Referring back to FIG. 1, after forming the connection holes 204, 204', at step 104 a first metal pattern (e.g., pattern 205 in FIG. 2) is formed on the first side 202 of the substrate 200. Referring now to FIG. 2, the first metal pattern 205 may include features such as shunt bars, coils, and current supply busses. Preferably, the first metal pattern 205 includes a first coil 210 which is connected to a pair of current supply buses 206, 206' through first shunt bars 208, 208'. The shunt bars 208, 208' electrically connect the coil 210 to the current supply busses 206, 206', which provide current to the first metal pattern 205 during a plating operation. The first coil 210 has turns or loops 211, 213, 215, and a second group of shunt bars 219, 219' are used to connect at least two loops in the first coil 210. Shunt bars 219, 219' reduce the amount of time required to electroplate the entire length of the first coil 210. As defined herein, a full loop, such as loop 211 or loop 213, is a portion of the first coil 210 which occupies a full revolution around the substrate 200 (e.g., from a starting point of the coil, such as connection hole 204 to corner 216). Each loop shown in FIG. 2 may be defined by a corner, such as corner 216 or 217 (which may be rounded), for illustrative purposes. Loop 215, beginning at corner 217 and ending at connection hole 204', is a partial loop since it does not complete a full revolution around the substrate 200. Preferably, the first metal pattern 205 comprises m number of loops and n number of shunt bars, where n is an integer of from m/2 to (m−1). Preferably, the connection holes 204, 204' are pre-formed so as to be positioned at opposing ends of the first coil 210. On the first side 202 of the substrate 200, each connection hole 204, 204' is surrounded by a ring 218, 218' which is connected with an end of the coil 210.

The first metal pattern 205 may be formed in a number of ways. In one embodiment, the metal pattern 205 is formed by depositing a metal layer onto the substrate and etching the metal layer. Preferably, the first metal pattern 205 is formed by depositing a first interface layer (not shown) onto the first side 202 of the substrate 200. The first interface layer can be an ultra thin layer having a thickness on the order of 300 Angstroms or less, and which may comprise a metal such as Pd, Pt, Bi, Pb, Sn, Cu, Ni, W, Al, Cr, Mo, Ti, Co, Fe, alloys thereof or a combination thereof. The first interface layer acts a seed layer from which the first metal pattern 205 can be grown through a plating operation.

The first interface layer may also be formed in a number of ways. For example, in one embodiment, the first interface layer is formed on the first side 202 of the substrate 200 using blanket deposition which may comprise, e.g., evaporation, physical vapor deposition, sputtering, or chemical vapor deposition, as is known in the art. Alternatively, blanket deposition may comprise spin-coating a nanoparticle ink comprising metal nanoparticles (which may be passivated) and a solvent, and curing the nanoparticle ink (see, e.g., U.S. Pat. No. 6,878,184, the relevant portions of which are incorporated herein by reference). Metals that may be deposited by such methods include elemental metals, such as aluminum, titanium, vanadium, chromium, molybdenum, tungsten, iron, nickel, palladium, platinum, copper, zinc, silver, gold, etc.; conventional alloys of such elements, such as aluminum-copper alloys, aluminum-silicon alloys, aluminum-copper-silicon alloys, titanium-tungsten alloys, aluminum-titanium alloys, etc.; and electrically conductive metal compounds, such as the nitrides and silicides of elemental metals (e.g., titanium nitride, titanium silicide, tantalum nitride, cobalt silicide, molybdenum silicide, tungsten silicide, platinum silicide, etc.). In other embodiments, the blanket depositing step may comprise spin-coating an ink containing the metal-containing material, the metal-containing material may comprise metal nanoparticles and/or organometallic precursors of one or more of the metals disclosed above, and/or the method may further comprise the step of curing or annealing the metal, organometallic precursor(s) and/or metal nanoparticles before the step of laser patterning.

Preferably, the first interface layer comprises a metal-containing ink having a seed material and a solvent to form a first ink pattern. In this manner, the first ink pattern can be formed by printing a metal-containing ink onto the first side 202 of the substrate 200, by essentially any conventional printing technology, as discussed at step 104. The first ink pattern mirrors the first metal pattern 205 on the substrate 100 and comprises a seed material and a solvent. The seed material may include one or more precursors that form a seed layer for subsequent electroplating or electroless plating upon conversion (e.g., drying and annealing), such as nanoparticles or an organometallic compound that decomposes into a thin metal film upon sufficient heating and/or irradiation.

In various embodiments, the seed material comprises a metal, such as Pd, Pt, Bi, Pb, Sn, Cu, Ni, W, Al, Cr, Ti, Co, Fe or Mo. The seed precursor compound in the ink is preferably an organometallic complex that includes the metal and one or more ligands selected from the group consisting of metal carboxylates, alkoxides, alkyls, aryls, alkynes, alkenes, beta-diketonates, amides and thiolates. In yet a further embodiment of the invention, the seed precursor comprises nanoparticles of a metal, such as Pd, Pt, Bi, Pb, Sn, Cu, Ni, W, Al, Cr, Ti, Co, Fe or Mo. The nanoparticles preferably have a size in a range of 1.0-100 nanometers. Methods for making metal nanoparticles and nanoparticle inks are described in U.S. patent application Ser. No. 10/215,952, entitled "Nanoparticle Synthesis and the Formation of Inks Therefrom", the contents of which are hereby incorporated by reference. The solvent in the printed ink pattern includes water, polar organic solvents such as alcohols and esters, and nonpolar organic solvents such as ethers and alkanes.

Printing the metal-containing ink to form the first ink pattern may comprise inkjet printing ("inkjetting"), screen printing, gravure printing, offset printing, flexography (flexographic printing), spray-coating, slit coating, extrusion coating, meniscus coating, microspotting, pen-coating, stenciling, stamping, syringe dispensing and/or pump dispensing the metal-containing ink in a predefined pattern onto substrate 200. The ink may comprise or consist essentially of the metal or seed precursor material and a solvent. The metal precursors that are generally compatible with printing (or plating onto a printed or laser written conductor or semiconductor precursor) may comprise organometallic compounds or nanoparticles (e.g., nanocrystals) of a metal such as titanium, copper, silver, chromium, molybdenum, tungsten, cobalt, nickel, gold, palladium, platinum, zinc, iron, etc., or metal alloys thereof, preferably silver or gold (or a metal alloy thereof). Such nanoparticles or nanocrystals may be conventionally passivated (e.g., with one or more surfactants) or unpassivated.

Thus, forming the first interface layer in the present method may comprise printing a metal-containing ink onto the substrate 200 to form the first ink pattern 205 on the first side 202 of the substrate 200. In such a process, the method may further comprise laser patterning, curing and/or annealing the metal-containing first ink pattern. In one implementation, converting the seed layer precursor to a seed layer comprises laser writing a seed layer of metal (e.g., Pd) using nanoparticles or a(n) (organometallic) compound of the metal. In the case where a metal-containing ink is printed onto the substrate 200 before laser irradiation, the amount of metal or metal precursor material used or consumed is significantly reduced. In the case where a metal-containing ink is first printed, then laser patterned, the combination of printing and laser patterning significantly reduces the amount of metal or metal precursor material used or consumed, while still providing the high resolution of laser patterning (relative to graphic arts printing technology). Where printing is followed by laser writing (e.g., direct irradiation of the metal or metal precursor material from the ink), the steps of resist deposition and removal are avoided (in comparison to blanket deposition followed by laser writing), in addition to the other advantages described herein.

Referring back to FIG. 1, whether printed or blanket-deposited, at step 106 the metal-containing ink and/or the seed material in the first interface layer is then heated and dried by conventional and/or otherwise known processes. Preferably, the first interface layer, which includes the seed material (e.g., an organometallic compound or suspension of metal nanoparticles), within the ink is heated and/or processed (e.g., irradiated and/or heated, optionally under a vacuum) sufficiently to remove substantially all carbon-based material. After sufficient heating, the first interface layer provides a surface on which a bulk conductive metal can be more easily electroplated or electrolessly plated. Heating the metal-containing ink and the plating material generally improves the electrical conductivity of the first interface layer, upon which the metal is plated. For example, metal precursor inks may be dried by heating the substrate 200 containing the printed metal precursor ink thereon at a temperature and for a length of time effective to remove the solvent and/or binder. Suitable temperatures for removing solvents from a printed ink may range from about 80° C. to about 150° C., or any range of temperatures therein (e.g., from about 100° C. to about 120° C.). Suitable lengths of time for removing solvents from a printed ink at such temperatures may ranges from about 10 seconds to about 10 minutes, or any range of times therein (e.g., from about 30 seconds to about 5 minutes, or about 1 minute to 3 minutes, etc.). Such heating may take place on a conventional hotplate or in a conventional furnace or oven, optionally (and in many cases, preferably) in an inert atmosphere.

Also, whether printed or blanket-deposited, the dried metal-containing material from the ink in the first interface layer may be further annealed at a temperature and for a length of time sufficient to improve its electrical and/or physical properties (e.g., conductivity, morphology, electromigration and/or etch resistance, stress and/or surface strain, etc.) and/or its adhesion to the underlying substrate. When the metal-containing ink is globally (blanket) deposited or printed, annealing is generally conducted to form a metal film on which a resist is deposited for subsequent laser patterning.

Also, when laser direct-writing a metal precursor ink results in a patterned metal and/or metal precursor, annealing is generally performed to form a metal layer with improved conductivity and adhesion. Such annealing may comprise either annealing of already-fused metal nanoparticles, or converting a patterned metal precursor layer into a patterned metal. Suitable temperatures generally range from about 100° C. to about 300° C., or any range of temperatures therein (e.g., from about 150° C. to about 250° C.). Suitable lengths of time for annealing may range from about 1 minute to about 2 hours, preferably from about 10 minutes to about 1 hour, or any range of times therein (e.g., from about 10 to about 30 minutes). Annealing may be conducted in a conventional furnace or oven, optionally in an inert or reducing atmosphere. Thus, the present method may further comprise the step of annealing the patterned metal in the first interface layer to improve its electrical, physical and/or adhesive properties.

After drying and heating the first interface layer, at step 110 a second metal pattern (e.g., pattern 209 in FIG. 3) is formed on the second side 203 of the substrate 200 opposite to the first side 202 and in alignment with the connection holes 204, 204'. The second metal pattern 209 may be formed in much the same way as the first metal pattern, as described above. The second metal pattern 209 may be formed in such a way so as to either simply strap one end of the first metal pattern 205 to the other (e.g., in alignment with a single connection hole), or the second metal pattern can comprise a second coil 210' having end to end connection with the first coil 210 through both of the pre-formed connection holes 204, 204'. The second metal pattern 209 includes features such as shunt bars, coils, and current supply busses, as for the first pattern (see FIG. 2). Referring back to FIG. 3, the second metal pattern 209 generally includes a second coil 210' which is connected to a second pair of current supply buses 207, 207' through second shunt bars 302, 302'. The shunt bars 302, 302' electrically connect the coil 210' to the current supply busses 207, 207', which provide current to the second metal pattern 209 during a plating operation.

Figure 3:
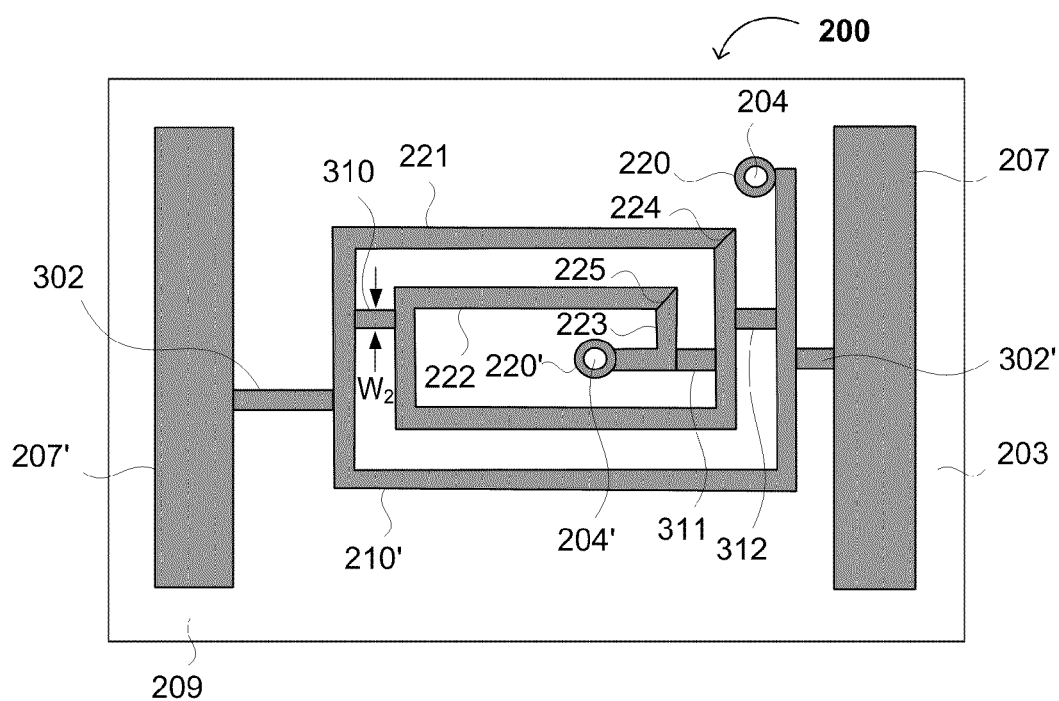
FIG. 3 shows a process of forming of a second metal pattern on a second side of a substrate, according to one embodiment of the present invention.

The second coil generally has a plurality of turns or loops 221, 222, 223, wherein a group of secondary shunt bars 310, 311, 312 connect at least two loops in the second coil 210' and effectively reduce the time for a subsequent electroplating operation. As defined herein, a full loop, such as with loops 221, 222, is a portion of the second coil 210' which occupies a full revolution around the substrate 200, e.g., from a starting point of the coil, such as connection hole 204, to an adjacent corner 224 in the adjacent coil loop. Exemplary loops as shown in FIG. 3 are separated by a corner line 224 or 225, for illustrative purposes. Loop 223, beginning at line 225 and ending at connection hole 204', is a partial loop since it does not complete a full revolution around the substrate 200. Preferably, the second metal pattern 209 comprises p number of loops, and q number of second shunt bars 310, 311, 312, where q is an integer of from p/2 to (p−1). Preferably, the number of loops in the first and second metal patterns 205, 209 are equal, that is m=p. Preferably, the connection holes 204, 204' are pre-formed so as to be positioned at opposing ends of the second coil 210', as shown in FIG. 3. On the second side 203 of the substrate 200, each connection hole 204, 204' is surrounded by a ring 220, 220' of seed and/or interface material, which is connected with an end of the coil 210'.

The second metal pattern 209 may be formed in any of the ways discussed above for the first metal pattern 205. Preferably, the second metal pattern 209 is formed in the same way as the first metal pattern 205. The second interface layer may thus be an ultra thin layer having a thickness on the order of 300 Angstroms or less, and comprise a metal such as Pd, Pt, Bi, Pb, Sn, Cu, Ni, W, Al, Cr, Mo, Ti, Co, Fe, alloys thereof or a combination thereof. The second interface layer generally acts a seed layer from which a bulk conductor can be grown through a plating operation onto the second metal pattern 209.

In one preferred embodiment, the second interface layer is formed by printing a metal-containing ink onto the second side 203 of the substrate 200, by printing, to form a second ink pattern. The ink for the second pattern 209 may contain the same composition as the first ink pattern, as discussed above.

Referring back to FIG. 1, whether printed or blanket-deposited, at step 112 the second interface layer is heated and dried by conventional and/or otherwise known processes, as discussed above for the first interface layer. In a preferred printing embodiment, the first ink generally is dried before the second ink is printed. To save processing time, where possible (e.g., where the seed materials for the first and second interface layers are the same), the first ink is dried but not further heated or annealed before the second ink is printed, then the two sides may be simultaneously heated and/or annealed as described above to improve the electrical and/or physical properties of the seed/interface layers.

After heating and drying the second interface layer, at step 114 metal is plated on both the first and second interface layers on both first and second sides 202, 203 of the substrate 200. The metal can be plated by a conventional electroplating or electroless plating process. Electroplating comprises applying an electropotential across and/or providing current to the current supply buses 206, 206', 207 and 207'. As current flows from one current supply bus 206, 207 to the second current supply bus 206', 207', metal ions or particles are attracted from the electroplating solution (which generally comprises a salt of the metal being electroplated) to areas of the second interface layer containing metal. The metal can also be plated on the first and second interface layers using any one of a number of electroless plating processes, which are commonly known. Alternatively, the metal can be plated by both electroless plating and electroplating (e.g., selectively depositing a thin conductive layer [e.g., Co, Ni, Cu, Pd, etc.] by electroless plating, then electroplating the bulk conductor [e.g., of the same or different metal]) onto the seed/interface layer(s).

Referring now to FIGS. 2 and 3, in one embodiment, the turns of the first and second coils 210, 210' may be initially shorted by using inner shunt bars 219, 219', 310, 311, 312 to decrease the distance from a power supply, and specifically, the current supply buses 206, 206' (first side) and 207, 207' (second side), to the inner turns or loops of the first and second coils, respectively. For the innermost loops of the coils 210, 210', the distance from the power supply is decreased dramatically. In this manner, a coil for a high frequency or RFID antenna can be plated in times significantly shorter than an otherwise identical antenna which is plated without such inner shunt bars.

Figure 4:
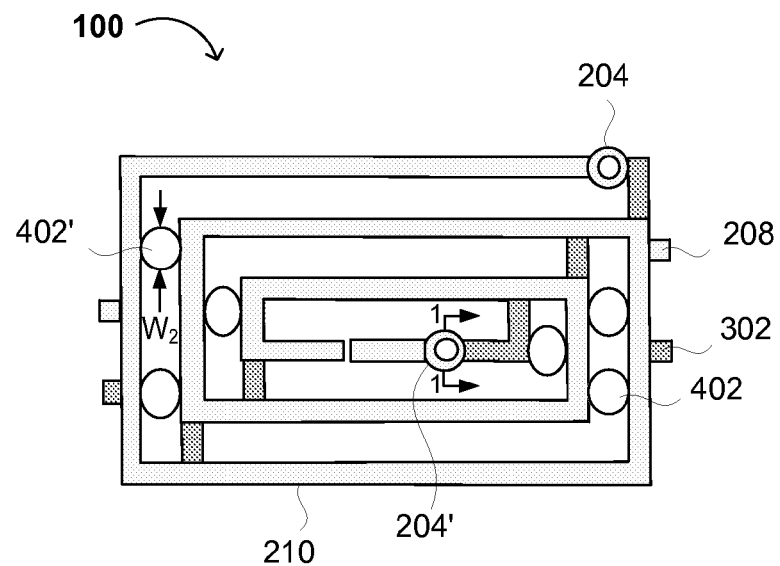
FIG. 4 shows an electronic device after first and second shunt bars are electrically disconnected and busses are sheared, according to one embodiment of the present invention.

After forming the bulk conductive metal on patterns 205, 209, the shunt bars 208, 208', 219, 219', 302, 302', 310, 311, 312 can then be removed in any known manner. Referring back to FIG. 1, such removal may comprise etching or (more preferably) punching or drilling disconnection holes in the substrate 200, as shown at step 120. Referring now to FIG. 4, preferably the shunt bars are punched out with a hole punch, forming disconnection holes 402, 402', at the end of the process to electrically isolate the turns of the coils 210, 210'. Upon forming the first and second metal patterns 205, 209, the disconnection holes 402, 402' are formed through the substrate 200. However, any known method or device for forming holes through a substrate may be used, such as etching a hole, drilling a hole, and using a laser to burn a hole.

Disconnection holes 402, 402' are formed through the substrate 200 over the shunt bars 208, 208', 302, 302' with sufficient width $w_1$, as shown in FIG. 4, to electrically disconnect the shunt bars 208, 208', 302, 302' from the first and second metal patterns 205, 209. Preferably, the width $w_1$ of the disconnection holes is greater than the width $w_2$ of the shunt bars 208, 208', 302, 302', as shown in FIGS. 3 and 4, more preferably with adequate margin (additional area) to compensate for misalignment of the hole punching or hole drilling process. Preferably, the locations of the first shunt bars 208, 208' are kept sufficiently distant from the locations of the second shunt bars 302, 302' so that during formation of disconnecting holes 402, 402', the disconnection holes 402 of the first shunt bars 208, 208' do not overlap with the disconnection holes 402' of the second shunt bars 302, 302'. More preferably, the locations of the disconnection holes 402, 402' are sufficiently distant from each other to provide mechanical support for any material subsequently formed on the substrate 200 between the disconnection holes 402, 402'.

The electronic device 100 of FIG. 4 (e.g., a double-sided RFID or high frequency antenna) includes a plurality of disconnection holes 402, 402'. In addition, the first and second shunt bars 208, 208', 302, 302' are electrically disconnected and the current supply buses 206 and 206' are sheared off from the substrate 200 in the electronic device 100. Preferably, the electronic device 100 comprises n+q disconnection holes 402, 402' after the first and second shunt bars 208, 208', 302, 302' are electrically disconnected and busses 206, 206' are sheared off, wherein m=p and q=n (m, n, p, and q all being defined elsewhere herein).

Figure 5:
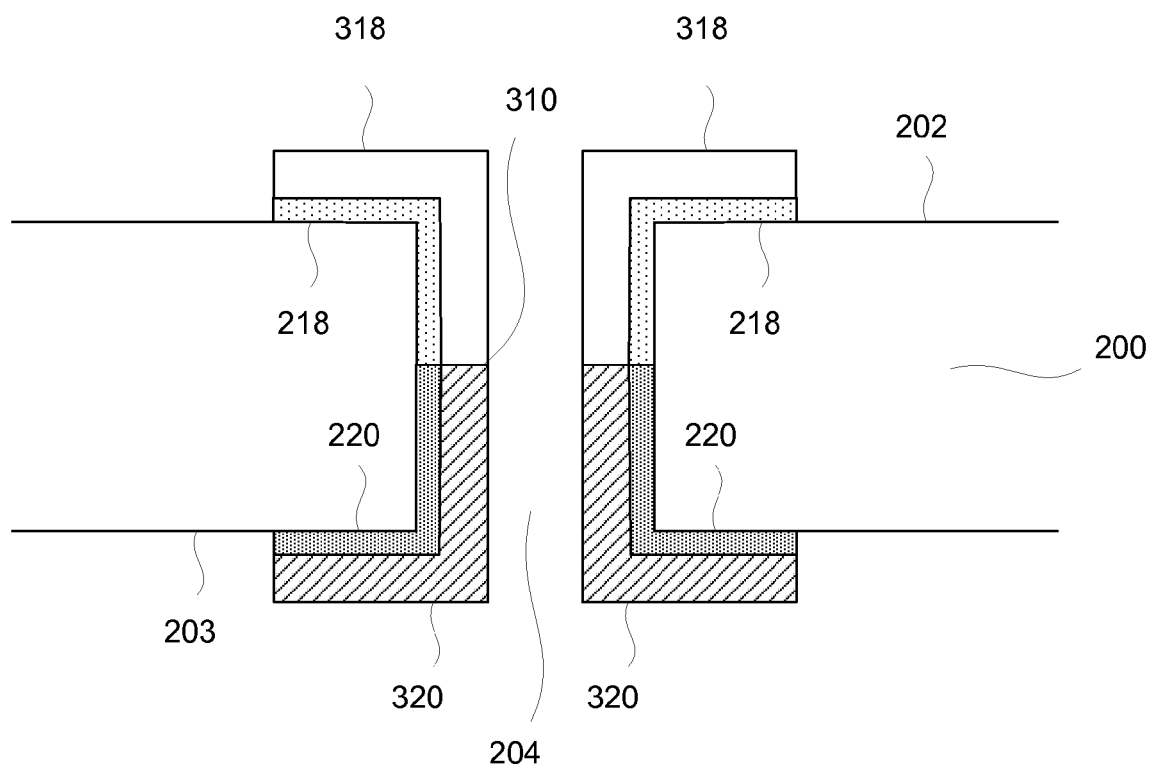
FIG. 5 shows a partial cross-sectional view along line 1-1 of the electronic device of FIG. 4, according to one embodiment of the present invention.

Preferably, the first and second interface layers are both formed on opposing sides of the substrate 200 before any plating operation is initiated. In this manner, plating of both the first and second interface layers, and therefore the formation of the first and second metal patterns 205, 209 can be carried out simultaneously. In addition to reducing the amount of steps to form the electronic device, and as shown in FIG. 5, this also provides the advantage of allowing seed material, such as metal-containing ink, from both the first and second interface layers to wet the edges of the connecting holes 204, 204' and come into contact with each other to form a connection 310 in the connection holes (e.g., hole 204) between connection hole portions 218, 220 of the first and second metal patterns. Once the plating operation is carried out, either by electroless plating or electroplating, bulk metal layers 318, 320 are formed on the first and second interface layers 218, 220 and form the connection 310 in the connection hole 204, as shown in FIG. 5.

The present invention, and more specifically the electronic device 100 formed by the above process, may be a high frequency antenna used in an RFID (Radio Frequency Identification Device) device or tag used to work with electronic identification and/or security systems that sense disturbances in radio frequency (RF) electromagnetic fields. Such electronic systems generally establish an electromagnetic field in a controlled area, defined by portals through which articles must pass in leaving the controlled premises (e.g., a retail store, library, etc.) or a space in which the article must be placed to be read and identified. A tag having a resonant circuit is attached to each such article, and the presence of the tag in the controlled area is sensed by a receiving system that detects the tag and processes information obtained therefrom (e.g., determines unauthorized removal of an article or the identity of goods in a container labeled with the tag). Most of the tags that operate on these principles are single-use or disposable tags, and are therefore designed to be produced at low cost in very large volumes.

Alternatively, the tag may take the form of a sensor, the RF signal modulation characteristics and/or properties of which may change as the characteristics and/or properties of the object or article to which it is attached change. For example, the tag/sensor may be attached to a stainless steel (or other metal) object, structure or surface. As the properties of the object, structure or surface change (e.g., the steel oxidizes, a metal having electromagnetic properties becomes magnetized or carries a minimum threshold electrical current, or the object or surface changes temperature by a predetermined difference or a threshold amount), the characteristics and/or properties of the RF signal radiated, reflected or modulated by the sensor may also change in a detectable manner.

The tags may be used (and, if desired and/or applicable, re-used) in commercial EAS and/or RFID applications and in essentially any frequency range for such applications. For example, the tags may be used at the frequencies, and in the fields and/or ranges, described in the Table below:

TABLE 1

Exemplary applications.

| Frequencies | Preferred Frequencies | Range/Field of Detection/ Response | Preferred Range/Field of Detection/ Response | Exemplary Commercial Application(s) |
|---|---|---|---|---|
| 100-150 KHz | 125-134 KHz | up to 10 feet | up to 5 feet | animal ID, car anti-theft systems, beer keg tracking |
| 5-15 MHz | 8.2 MHz, 9.5 MHz, 13.56 MHz | up to 10 feet | up to 5 feet | inventory tracking (e.g., libraries, apparel, auto/ motorcycle parts), building security/access |
| 800-1000 MHz | 868-928 MHz | up to 30 feet | up to 18 feet | pallet and shipping container tracking, shipyard container tracking |
| 2.4-2.5 GHz | about 2.45 GHz | up to 30 feet | up to 20 feet | auto toll tags |

The invention thus may also pertain to article surveillance techniques wherein electromagnetic waves are transmitted into an area of the premises being protected at a fundamental frequency (e.g., 13.56 MHz), and the unauthorized presence of articles in the area is sensed by reception and detection of electromagnetic radiation emitted by the device/tag. This emitted electromagnetic radiation may comprise second harmonic or subsequent harmonic frequency waves reradiated from sensor-emitter elements (such as the present inductor or inductor/capacitor structure) in a device that has been attached to or embedded in the articles, under circumstances in which the labels or films have not been deactivated or otherwise modified for authorized removal from the premises.

The present invention advantageously provides a more simplified and lower cost method for making an electronic device, such as a double-sided high frequency antenna, having first and second metal patterns 205, 209 on both sides of a two-sided substrate. Additionally, the method disclosed by the present invention allows for such a device to be manufactured in less time with fewer steps and better definition of the metal patterns.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method for making a double-sided electronic device on a semiconductor substrate having one or more pre-formed connection holes through the substrate, comprising the steps of:
  a) forming a first metal pattern on a first side of the substrate, including in the connection holes, the first metal pattern comprising a first coil and at least one first shunt bar connecting at least two loops in the first coil, wherein forming said first metal pattern comprises printing a first ink pattern comprising a plating material and a solvent, said plating material comprising an organometallic compound or suspension of metal nanoparticles which, after heating sufficiently to remove substantially all carbon-based material, provides a surface on which the metal can be electroplated or electrolessly plated;
  b) forming a second metal pattern on a second side of the substrate, in alignment with the connection holes, the second metal pattern comprising a second coil and at least one second shunt bar connecting at least two loops in the second coil, wherein the first metal pattern is coupled to the second metal pattern through a connection formed in said connection hole; and
  c) electrically disconnecting the first and second shunt bars.

2. The method of claim 1, wherein said step of forming said second metal pattern comprises printing a second ink pattern comprising a plating material and a solvent substantially in the form of the second metal pattern on the second side of the substrate.

3. The method of claim 1, wherein said step of forming said first metal pattern farther comprises plating metal on said first ink pattern.

4. The method of claim 2, wherein said steps of forming said first and second metal patterns comprise concurrently plating said metal on said first and second ink patterns.

5. The method of claim 2, wherein said plating material comprises an organometallic compound or suspension of metal nanoparticles which, after heating sufficiently to remove substantially all carbon-based material, provides a surface on which the metal can be electroplated or electrolessly plated.

6. The method of claim 1, printing the first ink pattern comprises printing metal nanoparticles and the solvent substantially in the form of the first metal pattern on the first side of the substrate.

7. The method of claim 6, wherein said step of forming said second metal pattern comprises printing a second ink pattern substantially in the form of the second metal pattern on the second side of the substrate.

8. The method of claim 1, wherein electrically disconnecting the first shunt bar comprises forming a disconnection hole in the substrate at a location of the first shunt bar of sufficient width to electrically disconnect the first shunt bar.

9. The method of claim 8, wherein the disconnection hole is formed by a hole punch.

10. The method of claim 9, wherein the hole punch is automated.

11. The method of claim 1, wherein the first metal pattern comprises a plurality of first shunt bars.

12. The method of claim 11, wherein the second metal pattern comprises a plurality of second shunt bars.

13. The method of claim 11, wherein the first metal pattern comprises m loops, and the plurality of first shunt bars comprises n first shunt bars, where n is an integer of from m/2 to (m−1), wherein m is an integer.

14. The method of claim 13, wherein the second metal pattern comprises p loops, and the plurality of second shunt bars comprises q second shunt bars, where q is an integer of from p/2 to (p−1), wherein p is an integer.

15. The method of claim 14, wherein m=p.

16. The method of claim 12, wherein the locations of the first shunt bars are sufficiently distant from the locations of the second shunt bars so that the disconnection holes disconnecting the first shunt bars do not overlap with the disconnection holes disconnecting the second shunt bars.

17. The method of claim 1, further comprising forming said connection hole in the substrate before forming the first and second metal patterns.

18. The method of claim 17, wherein the connection hole is formed using a hole punch.

19. The method of claim 18, wherein the hole punch is automated.

20. A method for making a double-sided electronic device on a semiconductor substrate having one or more pre-formed connection holes through the substrate, comprising the steps of:
  a) forming a first metal pattern on a first side of the substrate, including in the connection holes, the first metal pattern comprising a first coil and at least one first shunt bar connecting at least two loops in the first coil, wherein forming said first metal pattern comprises printing a first ink pattern comprising metal nanoparticles and a solvent;
  b) forming a second metal pattern on a second side of the substrate, in alignment with the connection holes, the second metal pattern comprising a second coil and at least one second shunt bar connecting at least two loops in the second coil, wherein the first metal pattern is coupled to the second metal pattern through a connection formed in said connection hole; and
  c) electrically disconnecting the first and second shunt bars.

21. The method of claim 20, wherein electrically disconnecting the first shunt bar comprises forming a disconnection hole in the substrate at a location of the first shunt bar of sufficient width to electrically disconnect the first shunt bar.

22. The method of claim 21, wherein the disconnection hole is formed by a hole punch.

23. The method of claim 22, wherein the hole punch is automated.

24. The method of claim 20, wherein the first metal pattern comprises a plurality of first shunt bars.

25. The method of claim 24, wherein the second metal pattern comprises a plurality of second shunt bars.

26. The method of claim 25, wherein the locations of the first shunt bars are sufficiently distant from the locations of the second shunt bars so that the disconnection holes disconnecting the first shunt bars do not overlap with the disconnection holes disconnecting the second shunt bars.

27. The method of claim 24, wherein the first metal pattern comprises m loops, and the plurality of first shunt bars comprises n first shunt bars, where n is an integer of from m/2 to (m−1), wherein m is an integer.

28. The method of claim 26, wherein the second metal pattern comprises p loops, and the plurality of second shunt bars comprises q second shunt bars, where q is an integer of from p/2 to (p−1), wherein p is an integer.

29. The method of claim 20, further comprising forming said connection hole in the substrate before forming the first and second metal patterns.

* * * * *